United States Patent
Kiefer et al.

(10) Patent No.: US 7,613,989 B2
(45) Date of Patent: Nov. 3, 2009

(54) DECODER FOR EXECUTING A VITERBI ALGORITHM

(75) Inventors: Felix Kiefer, Freiburg (DE); Miodrag Temerinac, Gundelfingen (DE)

(73) Assignee: Trident Microsystems (Far East) Ltd., Grand Cayman (KY)

(*) Notice: Subject to any disclaimer, the term of this patent is extended or adjusted under 35 U.S.C. 154(b) by 451 days.

(21) Appl. No.: 11/199,811

(22) Filed: Aug. 9, 2005

(65) Prior Publication Data

US 2006/0209996 A1     Sep. 21, 2006

(30) Foreign Application Priority Data

Aug. 9, 2004    (DE) ................... 10 2004 038 754

(51) Int. Cl.
*H03M 13/03*     (2006.01)
(52) U.S. Cl. .................... 714/795; 714/794; 714/796
(58) Field of Classification Search ......... 714/794–796
See application file for complete search history.

(56) References Cited

U.S. PATENT DOCUMENTS

| | | | |
|---|---|---|---|
| 4,614,933 A * | 9/1986 | Yamashita et al. ............ 341/51 |
| 4,757,506 A | 7/1988 | Heichler |
| 4,802,174 A * | 1/1989 | Hiraiwa et al. ............. 714/789 |
| 5,095,392 A * | 3/1992 | Shimazaki et al. ........... 360/40 |
| 5,220,570 A * | 6/1993 | Lou et al. ................... 714/791 |
| 5,291,499 A * | 3/1994 | Behrens et al. ............. 714/796 |
| 5,291,524 A * | 3/1994 | Itakura et al. ............... 375/341 |
| 5,408,502 A * | 4/1995 | How ........................... 375/340 |
| 5,410,555 A | 4/1995 | Itakura et al. |
| 5,432,803 A * | 7/1995 | Liu et al. ..................... 714/794 |
| 5,446,746 A * | 8/1995 | Park ........................... 714/795 |
| 5,448,583 A | 9/1995 | Miyamoto et al. |
| 5,509,021 A * | 4/1996 | Todoroki ..................... 714/795 |
| 5,717,706 A * | 2/1998 | Ikeda .......................... 714/786 |
| 5,724,394 A * | 3/1998 | Ikeda et al. ................. 375/341 |
| 5,878,060 A * | 3/1999 | Wakamatsu ................. 714/795 |
| 5,887,036 A | 3/1999 | Temerinac ................... 375/341 |
| 5,907,586 A * | 5/1999 | Katsuragawa et al. ....... 375/341 |
| 5,946,361 A * | 8/1999 | Araki et al. ................. 375/341 |
| 5,970,104 A * | 10/1999 | Zhong et al. ................ 375/341 |
| 6,094,739 A * | 7/2000 | Miller et al. ................ 714/792 |
| 6,272,661 B1 | 8/2001 | Yamaguchi |

(Continued)

OTHER PUBLICATIONS

G. David Forney, Jr., "The Viterbi Algorithm," Proceedings of the IEEE, vol. 61, No. 3, Mar. 1973, pp. 268-278.

(Continued)

*Primary Examiner*—Joseph D Torres
(74) *Attorney, Agent, or Firm*—O'Shea Getz P.C.

(57) ABSTRACT

A Viterbi decoder includes a computing device, a memory and a bus. The computing device receives sets of data values and calculates distances for the received sets of data values, accumulates and compares the calculated distances according to a Viterbi algorithm, decides data values and generates control signals dependent on a plurality of decisions associated with a plurality of paths. The memory stores the decided data values and provides at least one output value. The bus connects the computing device and the memory and is configured to convey the control signals to the path memory. The computing device or the memory shifts data strings in the memory according to conditions of the Viterbi algorithm with the control signals associated with the plurality of paths.

10 Claims, 9 Drawing Sheets

U.S. PATENT DOCUMENTS

| | | | |
|---|---|---|---|
| 6,317,472 B1 | 11/2001 | Choi et al. | |
| 6,385,258 B1 | 5/2002 | Ooya et al. | |
| 6,405,342 B1 * | 6/2002 | Lee | 714/792 |
| 6,792,570 B2 * | 9/2004 | Takahashi et al. | 714/795 |
| 6,799,296 B2 * | 9/2004 | Kong et al. | 714/795 |

OTHER PUBLICATIONS

Burkhardt et al., "Contributions to the Application of the Viterbi Algorithm," IEEE Transactions on Information Theory, vol. IT-31, No. 5, Sep. 1985, pp. 626-634.

Paaske et al. "An area-efficient path memory structure for VLSI implementation of high speed Viterbi decoders", 8220 Integration, the VLSI Journal, North-Holland Publishing Company, Amsterdam, NL, Nov. (1991), vol. 12, No. 1, pp. 79-91.

Steinert et al. "Power Consumption Optimization for Low Latency Viterbi Decoder", Proc. 2004 International Symposium on Circuits and Systems, vol. 2, 23, May 2004, pp. 377-380.

Bonek et al. "A Variable Rate Constraint Length K=5 Viterbi Decoder for 12 Mb/s, Proc. Canadian Conference on Electrical and Computer Engineering", Sep. 14, 1993, pp. 582-585.

Cypher et al. "Generalized Trace-Back Techniques for Survivor Memory Management in the Viterbi Algorithm", 8367 Journal of VLSI Signal Processing, Kluwer Academic Publishers, Boston, vol. 5, No. 1, pp. 85-94, Jan. (1993).

Ranpara et al. "A Low-Power Viterbi Decoder Design for Wireless Communications Applications", Proc. ASIC/SOC Conference 1999, Sep. 15, 1999, Washington, USA, pp. 377-381.

Shim et al. "Pipelined VLSI Architecture of the Viterbi Decoder for IMT-2000", Global Telecommunications Conference-Globecom 1999, vol. 1A, 5, Dec. 1999, pp. 158-162.

* cited by examiner

DECODER FOR EXECUTING A VITERBI ALGORITHM

PRIORITY INFORMATION

This application claims priority from German application 10 2004 038 754.0 filed Aug. 9, 2004.

BACKGROUND OF THE INVENTION

The invention relates in general to decoders and in particular to a decoder for executing a Viterbi algorithm.

A Viterbi algorithm makes it possible to correct transmission errors in communications systems. The application of a Viterbi algorithm is also known from many other search problems, for example in the field of pattern recognition. The Viterbi algorithm has a disadvantage that the computation is very complex, thereby requiring a relatively large amount of memory resources. As a consequence, a system clock frequency of a decoder for executing a Viterbi algorithm is typically correspondingly high. The system clock frequency at which the individual operations of the Viterbi algorithm are to be executed is generally several times higher than the data rate when the algorithm is employed in communications systems. This requirement is of note particularly in systems having very high data rates, such as digital video broadcasting ("DVB") systems, because the requisite clock frequencies necessitate the use of relatively expensive technology.

The principle of a Viterbi decoder is known, for example, from G. David Forney, Jr., "*The Viterbi Algorithm*," Proc. IEEE, Vol. 61, No. 3, March 1973, pp. 268-278. Modules used in such a decoder for calculating distances or total distances and for calculating accumulations and comparisons, as well as a generic structure of a logical module for a Viterbi decoder, are employed in decoders according to European Published Patent Application EP 0 769 853 A1. Possibilities for parallelization are known from H. Burckhardt and L. C. Barbosa, "*Contributions to the Application of the Viterbi Algorithm*," IEEE Trans. on IT, Vol. 31, No. 5, September 1985, pp. 626-634.

Prior art Viterbi decoders and Viterbi algorithms typically require a relatively high system clock frequency.

One embodiment of a prior art Viterbi decoder 10 having a degree of parallelization p is illustrated in FIG. 8. Via a receiver bus 12, K×N bits of received data r(n, k) are provided to a total-distance module 14. In the module 14, total distances are calculated and correspondingly $2^K \times (N+1d(K))$ bits are provided on a bus 16 to a computing device 18 having accumulate-and-compare modules 20. The total distances are stored in a temporary memory 22. Via a bidirectional distance bus 24, $2\times(N+1d(K)+1)\times 2^{p+1}$ bits are correspondingly transmitted from the computing device 18 to a distance memory 26 that stores $(N+1d(K)+1)\times 2^{L-1}$ bits. Here L is the length of generator polynomials, of which a set containing a number K is to be considered in the calculation. The received data r(n, k) on the bus 12 are resolved to N bits. The degree of parallelization is p. From the distance memory 26, a corresponding number of $2\times(N+1d(K)+1)\times 2^{p+1}$ bits are transmitted on the distance bus 24 back to the computing device 18.

The computing device 18 is also connected to a path memory 28 via a bidirectional path bus 30 where $2\times T\times 2^{p+1}$ bits are transmitted from the path memory 28 or a second temporary memory 32 of the computing device 18 to and from the path memory 28 via the path bus 30. In the path memory 28, $T\times 2^{L-1}$ bits are stored. After corresponding calculations, in particular accumulations and comparisons, have been executed in the accumulate-and-compare modules 20, a search is executed in the computing device 18 and a data bit string c(n, k) determined to be the most desirable is furnished on a line 34 at the output of the Viterbi decoder 10.

In such a Viterbi decoder 10, a lower system clock frequency can be attained with a plurality of parallel modules, depending on the degree of parallelization (0<p<L−2). In the case where the system clock frequency is equal to the data rate (p=L−2), all $2^{L-1}$ accumulate-and-compare modules 20 are implemented in parallel. The bus then becomes the limiting factor. For available embodiments, it may be that no acceptable compromise can be found between the system clock frequency and the requisite bus widths of the path bus 30 and the distance bus 24.

FIG. 9 illustrates the ratio between the system clock frequency and bus width as functions of the degree of parallelization p for the case of such a Viterbi decoder for DVB systems. Typical parameters are L=7, K=2 and T=64 for data rates up to 50 Mbit/s. If there is no parallelization (p=0) and the bus width is relatively small, a system clock frequency of 1600 MHz is used. If the system clock frequency is to be equal to the data rate (i.e., the degree of parallelization is p=5) a bandwidth of 9000 bits is needed for the bus width. In practice this is not acceptable in light of the realization and the costs arising therefrom. Given an acceptable system clock frequency of up to 100 MHz (p=4), the requisite bus width of 4500 bits is still relatively high for a commercially favorable approach.

What is needed is a Viterbi decoder for executing a Viterbi algorithm that allows the system clock frequency to equal the data rate at relatively high bit rates.

SUMMARY OF THE INVENTION

A Viterbi decoder includes a computing device that receives sets of data values and calculates distances from the received data values and accumulates and compares the distances according to a Viterbi algorithm and decides data values. Also included is a path memory for storing decided-upon data values. A bus connects the computing device and the path memory. The computing device generates control signals dependent on the decisions that are associated with paths. The bus conveys the control signals to the path memory. The computing device and/or the path memory shifts data strings with the control signals associated with the paths in the path memory according to conditions of the Viterbi algorithm. The path memory provides at least one output value.

The computing device evaluates the requisite distances, for example all distances required for each set of received values (e.g., in one module), and accumulates and compares the associated distances according to the Viterbi algorithm, where, for example the relatively smallest distances may be selected and stored in a distance memory.

The computing device and/or the path memory may delay the data strings in a second part of the path memory using simple shift registers to compensate for the time required for a search among the selected accumulated distances.

The computing device and/or the path memory may provide from the path memory, for example, from a shift register in the path memory, the output value that corresponds to the path found by the search having the relatively smallest distance.

The computing device may subtract a found distance from all accumulated distances in the next decoder cycle.

The path memory may be structured in a row-wise manner to accept row-wise paths from the data strings that have led, upon decision, to a state and that are to be newly shifted in each decoder cycle, for example, to accept paths m(p, t), p=0, 1, ..., P−1, where P is the number of paths, t=0, 1, ..., T−1+D, where T is the decoder depth and D is the delay.

The path memory may have two parts and executes the shift according to the Viterbi algorithm in the first part, with a specified length T, and a simple shift using shift registers with a further length D in the second part.

The computing device and/or the path memory may write, in each decoder cycle, the initial value in each path ({m(p, 0), p=0, 1, ..., P−1}) according to a fixed pattern that depends on a path number.

The computing device and/or the path memory may control the data shift with respect to paths m(p, t) in the first part of the path memory using control signals at the input of the path memory, for example, according to $$m(p, t)=m(2p+s(p), t-1), \text{ with } p=0, 1, \ldots, P/2-1 \text{ and}$$

$$m(P/2+p, t)=m(2p+s(P/2+p), t-1), \text{ with } t=1, 2, \ldots, T-1,$$

where $s(p)\epsilon(0, 1, \ldots, S-1)$, for $p=0, 1, \ldots, P-1$, and S is the number of possible data values.

The computing device and/or the path memory may execute a simple shift in a second part of the path memory, for example, according to $$m(p, t)=m(p, t-1), \text{ with } p=0, 1, \ldots, P-1, t=T, \ldots, T+D-1,$$

and/or to determine as the output value the selected path (q) having the relatively smallest distance, for example, according to output=m(q, T+D−1).

The decoder may have three modules for evaluating, accumulating and comparing the distances, generating control signals, and executing the search. The decoder may also include a temporary memory for time compensation, a distance memory, and the path memory. A bidirectional bus may be arranged between the distance memory and the computing device for reading the accumulated distance from the next-to-last decoder cycle and storing newly computed accumulated distances. A unidirectional bus may be arranged between the computing device and the path memory for transmitting control signals for the shift in the memory and transmitting an address of the path having the relatively smallest accumulated distance.

The decoder may have a system clock frequency equal to the decoder cycle frequency or the data rate. As such, the number of accumulate-and-compare modules of the computing device are equal to the number of states, for example, paths. The bus width of the bus to the distance memory may be sized for reading and storing the distances for all paths at the same time, with the bus to the path memory carrying all the control signals at the same time.

The decoder may have a system frequency as a multiple X of a data rate or a decoder cycle frequency. As such, the number of accumulate-and-compare modules in the computing device are P/X, with P being the number of paths or states, the bus to the distance memory reading and storing P/X distances, and the bus to the path memory carrying P/X control signals, for example, at the same time.

The decoder may process data as binary data for encoding (S=2) and may process data values, for example, bit strings, encoded with a convolutional encoder of a length (L bits) and an encoding rate (1/K). The reception range is resolved to N bits on a range of whole numbers from 0 to 2N−2, the number of possible states or paths is 2L−1, and the ratio between the system frequency and the data rate is a power of two (X=2x, x=0, 1, ..., L−2). Further, the bus width to the distance memory may be of a size for reading and storing a total of 2(N+1d(K)+2)2x+1 bits at the same time, and the bus width to the path memory may be 2x+1 bits for control signals and L−1 bits for the address of the path having the relatively smallest accumulated distance.

The decoder of the invention makes it possible to fabricate commercially favorable IC (integrated circuit) solutions. The proposed decoder architecture includes the computing devices adapted for the Viterbi algorithm and a relatively efficient approach to a memory structure that can replace its contents in accordance with the Viterbi algorithm within, for example, a single system clock cycle.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
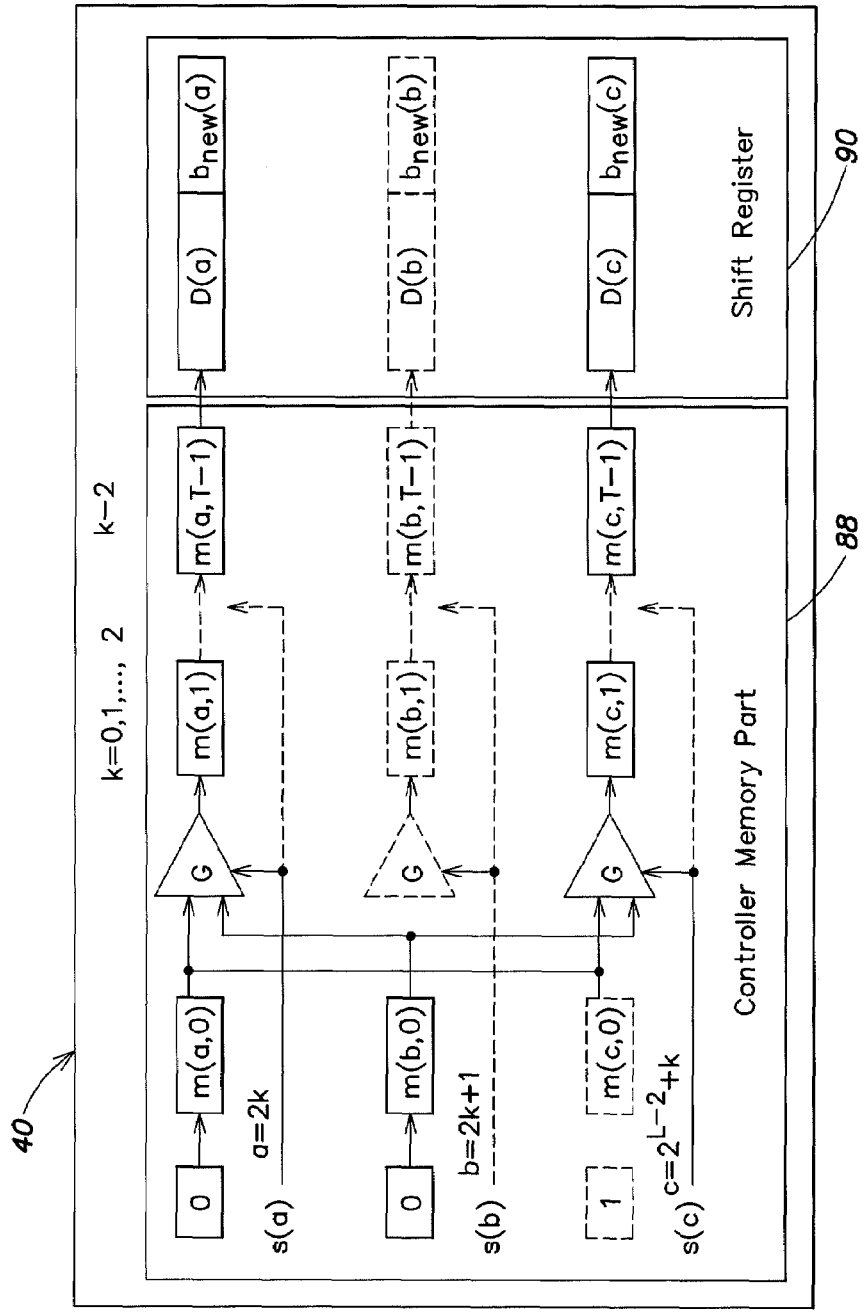
FIG. 1 is a block diagram illustration of a memory portion of a Viterbi decoder.

Referring to FIG. 1, a two-part structure of a memory device 40 as a part of a Viterbi decoder may be used in conjunction with a Viterbi algorithm at relatively high data rates. A relatively simple construction of the memory 40 is possible using simple technology due to the structure of a path memory as the memory 40 is adapted according to the Viterbi algorithm. Here the dependence between the system clock frequency and the bus width is separated for every degree of parallelization.

A Viterbi algorithm is executed in a Viterbi decoder in a known manner. In a communications system, for example, the Viterbi decoder is situated in a receiver-side device and is part of relatively extensive signal processing comprising, for example, demodulation, equalization, etc.

Figure 3:
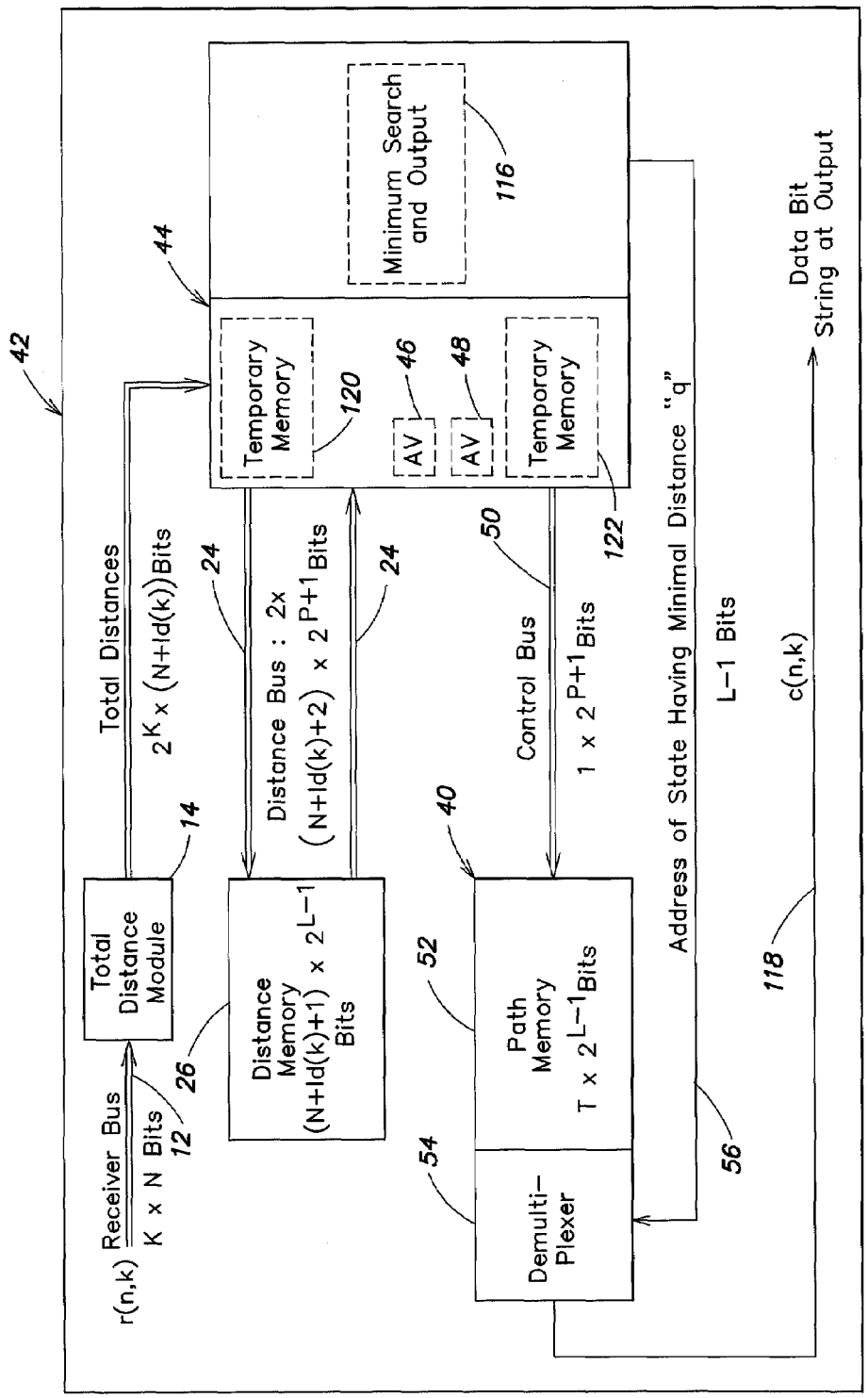
FIG. 3 is a block diagram of various components of a Viterbi decoder having the memory portion of FIG. 1.

A Viterbi decoder 42 having the memory 40 of FIG. 1 is illustrated in FIG. 3. In comparison to the prior art Viterbi decoder 10 of FIG. 8, the Viterbi decoder 42 of FIG. 3 differs in particular in how a computing device 44, which comprises accumulate-and-compare modules 46, 48 for accumulating and comparing distances, is connected to the memory device 40 described of FIG. 1. The connection comprises a unidirectional control bus 50 for transmitting, for example, 1×2$^{p+1}$ bits from the computing device 44 to the memory device 40.

The memory device 40 includes a path memory 52 having a memory capacity of $T \times 2^{L-1}$ bits, and a demultiplexer 54. The computing device 44 includes an output on a line 56 from which the address of the state having the determined relatively smallest or "minimal" distance q is provided to the demultiplexer 54. The address comprises L−1 bits. From the demultiplexer 54 or the memory device 40, the corresponding data bit string c(n, k) is conveyed on a line 118 at an output of the Viterbi decoder 42.

A received value r(n, k) is associated with each encoded bit c(n, k) of the output data on the line 118. From the received values r(n, k), the Viterbi algorithm reconstructs, with as few errors as possible, a data bit string {b(n)} sent by a transmitting device. The following prerequisites govern the usage of the Viterbi algorithm.

The received value range extends between two nominal values that correspond to the two possible values {W0 and W1} of an encoded bit (0 or 1). In the extreme case referred to as "hard decision," the received value range includes only the two nominal values. The efficiency of the decoder improves if the received value range is more highly resolved, a situation referred to as "soft decision."

As a second prerequisite, a distance metric is defined in terms of the distance between received values and nominal values according to equation 1:

$$d_0(r) = \text{distance}\{r, W_0\} \text{ and } d_1(r) = \text{distance}\{r, W_1\}, \quad (1)$$

where $d_0$ and $d_1$ describe deviation values or distances and the assumption is made that a smaller distance from a nominal value W indicates a higher probability for this value. The maximal distance $d_0(W_1) = d_1(W_0) = d_{max}$ defines a symmetrical received value range. The metric may be further defined such that the sum of two distances always remains constant for each received value r(n, k), so that $d_0(r) + d_1(r) = d_{max}$.

A third prerequisite is assumed with respect to a received value range. The received value range and the metric applied are to guarantee the existence of a neutral value $W_n$ such that $d_0(W_n) = d_1(W_n) = d_{max}/2$. This neutral value is needed to replace missing received values r(n, k) that correspond to encoded bits c(n, k) omitted as a result of puncturing.

A fourth prerequisite commonly relates to a structure for the application of the Viterbi algorithm. For each of the $2^{L-1}$ possible states, this structure includes a distance accumulator $\{A_q(n), q=0, \ldots, 2^{L-1}\}$ and a path memory 52 with $\{M_q(n) = \{m_q(n,0), \ldots, m_q(n, T-1)\}, q=0, \ldots, 2^{L-1}-1\}$ of length T bits in which are stored all decided-upon bits b up to time n that have led to the state. Parameter T defines a decoding depth, which directly determines the efficiency of the Viterbi decoder 42.

The Viterbi algorithm includes a plurality of steps for each new input of K received values $\{r(n, 0), \ldots, r(n, K-1)\}$.

In a first step, a total distance is calculated. Because a set of K bits corresponds to one bit from the data bit string, a total distance for the entire set of bits is used according to equation 2:

$$d_{c(0), c(0), \ldots, c(K-1)}\{r(n, 0) r(n, 1), \ldots, r(n, K-1)\} = \sum_{k=0}^{K-1} d_{c(K)}(r(n, k)). \quad (2)$$

With K bits $\{c(0), c(1), \ldots, c(K-1)\}$, the number of distinct total distances that are calculated for a set of K received values is $2^K$.

Figure 11:
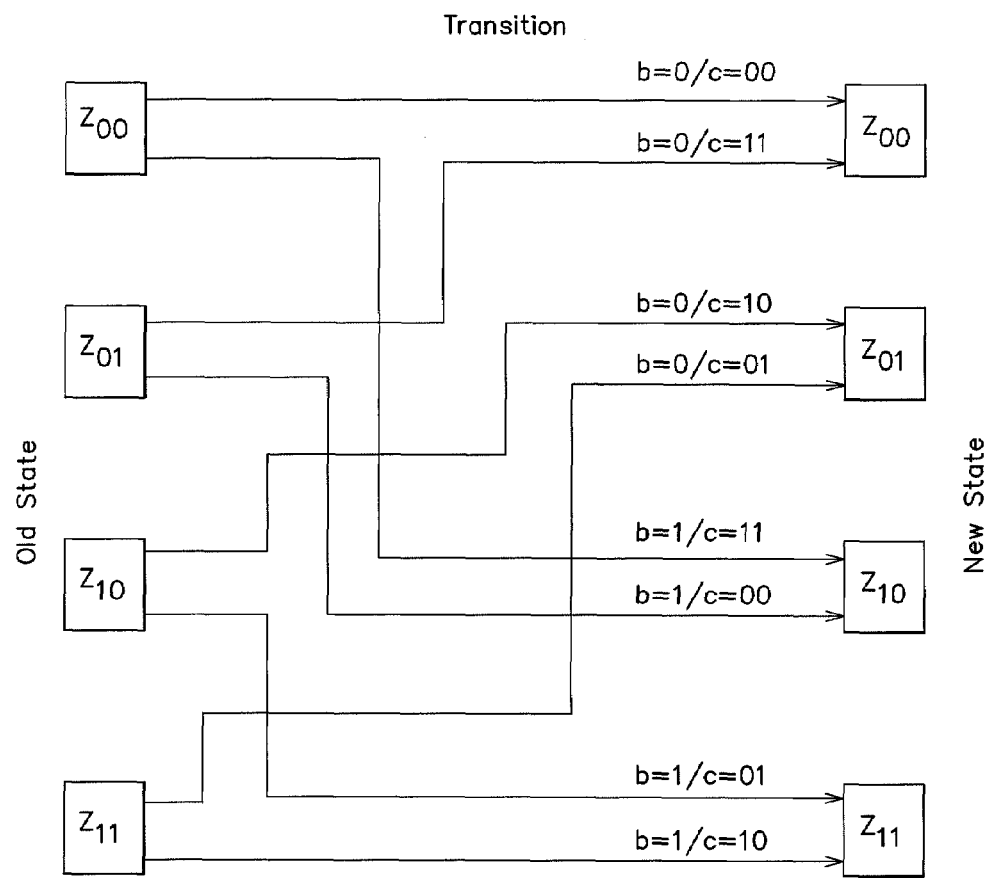
FIG. 11 is a state diagram of a convolutional encoder for the convolutional encoding principle illustrated in FIG. 10.

In a second step, two competing values for each state are calculated and compared for the distance accumulator. This is also referred to as an accumulate and compare operation as given by equation 3:

$$\begin{aligned} A_{new/0} &= A_{old/b=0} + d_{c/b=0} \\ A_{new/1} &= A_{old/b=1} + d_{c/b=1} \end{aligned}, s = \begin{matrix} 0 & A_{new/0} < A_{new/1} \\ 1 & A_{new/0} \geq A_{new/1} \end{matrix}, \quad (3)$$

where, according to a conventional state diagram, which is illustrated in FIG. 11, the values $A_{old/b}$ from the distance accumulators arise from two possible prior states and the values $d_{c/b}$ as total distances correspond to the K encoded bits.

In a third step, the following values are associated and shifted according to the comparison result s, specifically the distance accumulator $A_{new} = A_{new/s}$, the path memory $M_{new}$: $m_{new}(n, 0) = b$; $m_{new}(n, t) = m_{old/s}(n, t-1)$, $t=1, \ldots, T$, and the candidate bit for output $b_{new} = m_{old/s}(n, T-1)(4)$, the candidate bit b following a fixed specified pattern according to the state diagram, in which the first half of the states are assigned a 0 and the remainder of the states are assigned a 1.

In a fourth step, the state having the minimal distance accumulator q determines the newly decided-upon bit b at the output according to equation 4:

$$A_{min} = A_q(n) = \min_{x=0,\ldots,2^{L-1}-1}\{Ax(n)\} \Rightarrow b(n) = b_{new/q}. \quad (4)$$

This bit is typically from the sent data bit string b(n−T). The delay of T is due to the decoding process.

In a fifth step, the values in the distance accumulators thus remain limited, the minimum $A_q(n)$ of all the newly obtained values in the distance accumulators being subtracted for this purpose according to $A_{new}(n) = A_{new}(n) - A_q(n)$.

In a sixth step, these values are employed as old values in the next pass or employed as values that are to be used in the next cycle, so that according to equation 5:

$$A_{old}(n+1) = A_{new}(n) \text{ and } M_{old}(n+1) = M_{new}(n). \quad (5)$$

By way of illustration, a frequently applied method is represented for an exemplary convolutional code. If the received values are resolved to N bits, the reception range will include values $\{0, 1, \ldots, 2^N-2\}$, with $W_0=0$, $W_1=2^N-2$ and $W_n=2^{N-1}-1$. For this purpose, a simple metric is adapted as per equation 6:

$$d_0(r)=r \text{ and } d_1(r)=2^N-2-r \text{ for } r \in \{0, \ldots, 2^N-2\}$$

$$\Rightarrow d_{max}=2^N-2 \text{ and } 0 \leq d_0(r), d_1(r) \leq 2^N-2. \quad (6)$$

The value range of the total distances, that is, a total of $2^K$ values according to equation (2), is then limited to 1d(K)+N and the value range of the distance accumulators is one bit larger.

Figure 5:
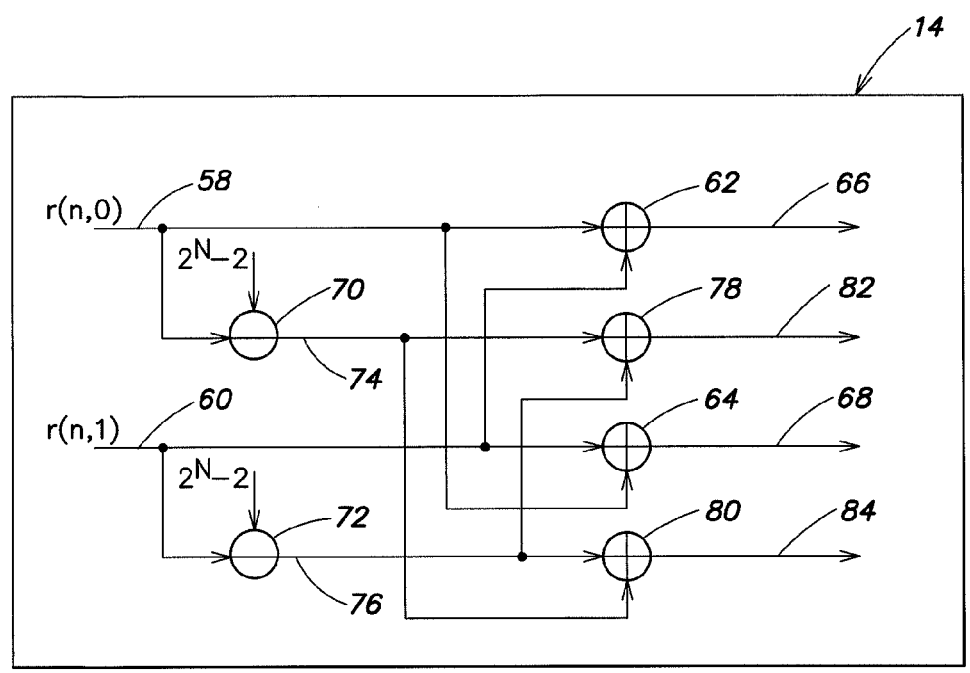
FIG. 5 is a block diagram of a prior art distance-calculating module.
Figure 8:
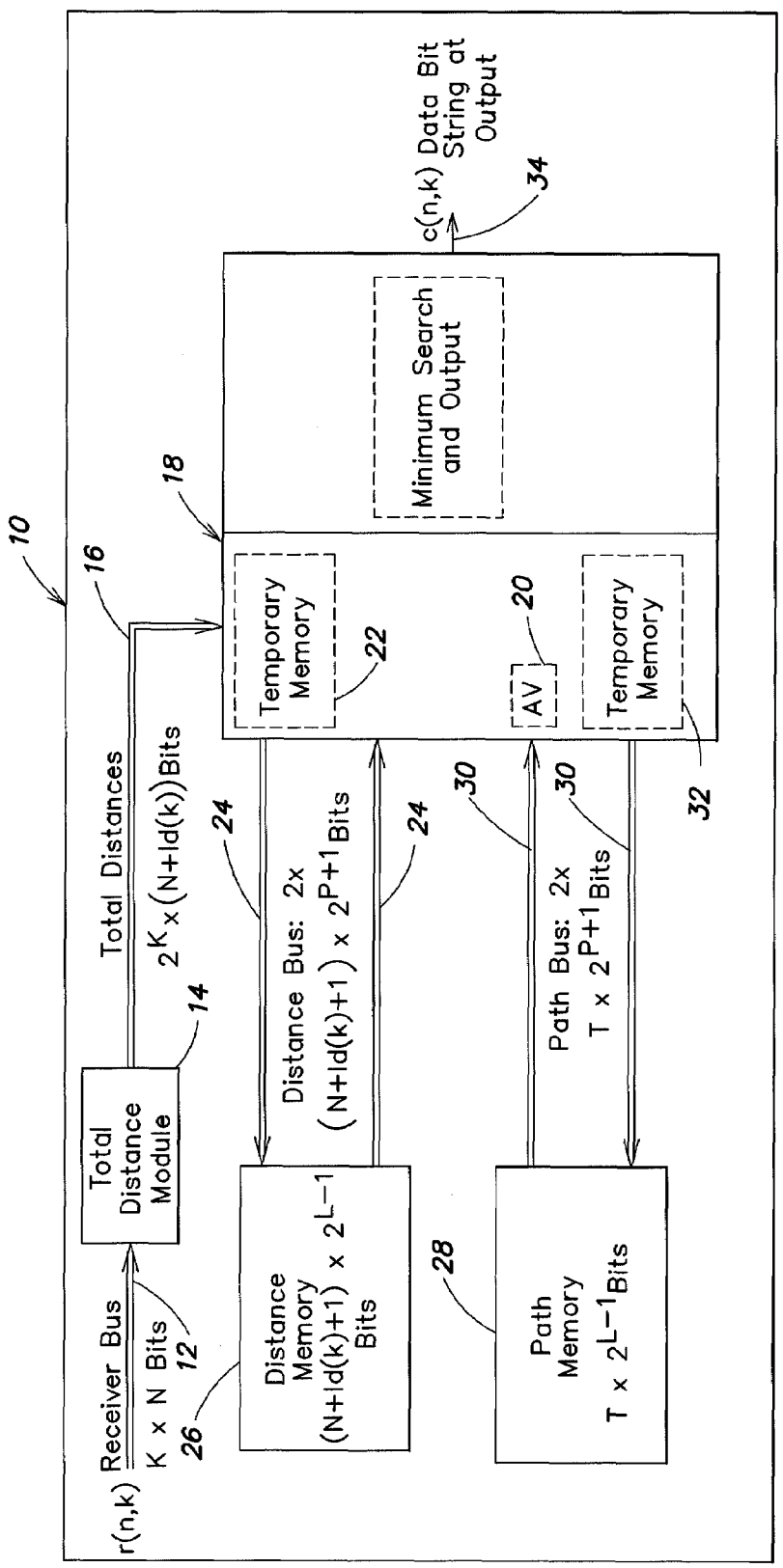
FIG. 8 is a block diagram of various components of a prior art Viterbi decoder.

The Viterbi decoder 42 of FIG. 3 and the prior art Viterbi decoder 10 of FIG. 8 each include some components that are the same, for example, the receiver bus 12, the distance-calculating module 14, the distance bus 24, and the distance memory 26. The distances or total distances may be determined, for example, in accordance with at least equation (2). The total distance module 14 is used to calculate the distances. According to FIG. 5, a known distance-calculating module 14 comprises two inputs for the input of received data values r(n, 0) and r(n, 1) on lines 58, 60, which have been subjected to appropriate preliminary processing. Each of these data values r(n, 0), r(n, 1) is fed to a corresponding first and third adder 62, 64, respectively. The other one of these two data values r(n, 1) or r(n, 0) is fed to the first and third adders 62, 64, respectively. Also, data values $d_{00}$ and $d_{10}$ are output on lines 66, 68 from the adders 62, 64, respectively. Further, received data values r(n, 0), r(n, 1) are each fed to an associated subtraction element 70, 72 that subtracts $2^N-2$. The subtraction results on lines 74, 76 are each fed to a second and a fourth adder 78, 80, respectively. The subtraction results on the lines 74, 76 are also cross-fed to these adders 78, 80. The results from these adders 78, 80 are output on lines 82, 84 as further data values $d_{11}$ and $d_{01}$ respectively.

Steps 2 and 3 of the Viterbi algorithm represent the actual base operation for the Viterbi decoder 42 and are the accumulate and compare operations. These steps are executed in one or, according to the invention, a plurality of parallel accumulate-and-compare modules 46, 48 (FIG. 3) for accumulating and comparing the distances.

Figure 7:
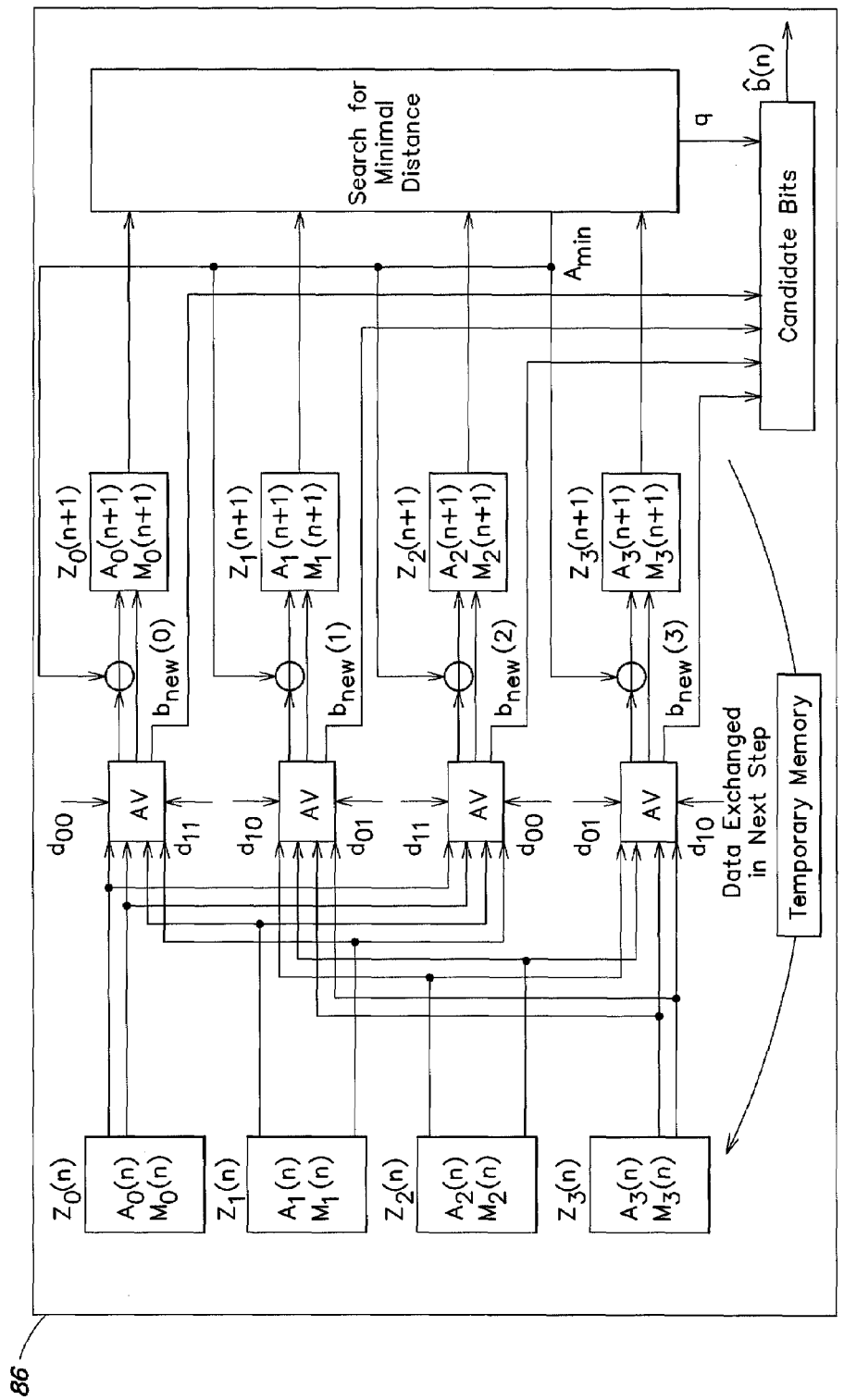
FIG. 7 is a block diagram of a prior art Viterbi decoder.

FIG. 7 illustrates a generic structure of a known Viterbi decoder 86 for implementing equation (5). The decoder 86 exhibits symmetry that makes the various kinds of parallelization possible. For every number of states, it is possible to identify a smallest processing step in which two states are to be handled in one step. The unlike sequences of input and output states, however, prohibit overwriting of old values as soon as new ones are calculated.

"In-place" calculation is consequently not possible, so that a temporary memory is used which holds the newly calculated values $A_{new}$, $M_{new}$ until the correct moment for overwriting. In terms of realization, the size of this temporary memory for all states lies between values of ¼ and 1.

Given a degree of parallelization p, the structure of the Viterbi decoder 86 requires $2 \times 2^p$ accumulate-and-compare modules in a parallel implementation, and the entire six-step procedure is executed $2^{L-3-p}$ times for each output bit. The ratio of system clock frequency and data rate can be thus determined. If L=7, for example, there are two extrema. With 64 accumulate-and-compare modules, p=5, and the system clock frequency is equal to the data rate. With just two accumulate-and-compare modules, p=0, and the system clock frequency is a factor of 32 higher than the data rate.

Figure 6:
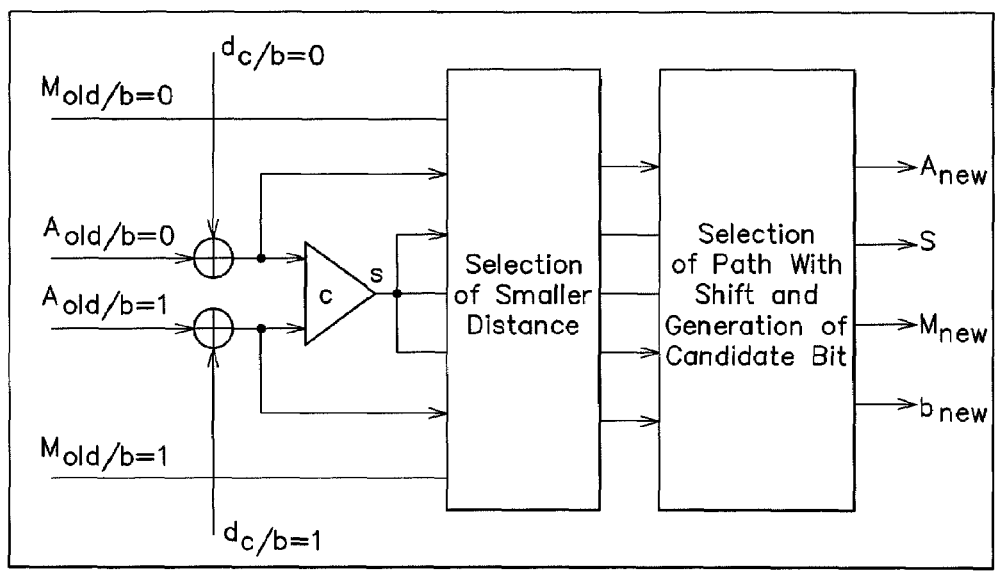
FIG. 6 is a block diagram of a prior art module for accumulating and comparing distances.

The known generic structure of the Viterbi decoder according to the foregoing preferred exemplary embodiment can be generalized without substantial structural differences. If the original data string, instead of binary elements or bits, contains symbols from a polyvalent alphabet having $N_s$ symbols, a polyvalent arithmetic being applied in the convolutional encoder and in the calculation of distances, there are $N_s^{L-1}$ possible states and a plurality $N_s$ of paths leading to each state upon a transition in the state diagram. This requires a comparison of $N_s$ distances in the accumulate-and-compare module. Bits are also replaced with symbols in the Viterbi decoder 42 of the present invention. The structure of the decoder of FIGS. 5-7 and procedural steps 1-6 of the Viterbi decoder remain largely unchanged.

FIG. 1 illustrates a memory device 40 having a two-part construction. The first part is a controlled memory portion 88 under the control of additional control signals s. The second part comprises a shift register 90.

The structure of the memory device 40 introduces the additional control signals $\{s(k), k=0, \ldots, 2^{L-1}\}$ in the path memory 52, organized in matrix fashion, for the individual data elements $\{m(k, t), k=0, \ldots, 2^{L-1}, t=0, \ldots, T-1\}$, which, according to the state diagram and according to the comparison result, make possible all requisite shifts between the individual paths directly in the memory. In this way, the corresponding path bus of the prior art is replaced by the substantially narrower control bus 50 as a control bus for transmitting $2^{L-1}$ bits.

In the first part 88 of the memory 40, a shift of each bit between the individual paths by a demultiplexer controlled by the control signals s(k) is possible. Only the first bits are specified in all paths, zeroes being specified in the first half and ones in the second half. Before all other bits there is a demultiplexer according to the transition rules of equation (5). The upper transition is selected if s=0 and the lower transition if s=1.

The second part 90 of the memory device 40 comprises simple shift registers which serve to compensate for the processing delays. The length of the shift register 90 may match the number of delay cycles in the accumulate-and-compare modules and in the minimum search.

Figure 2:
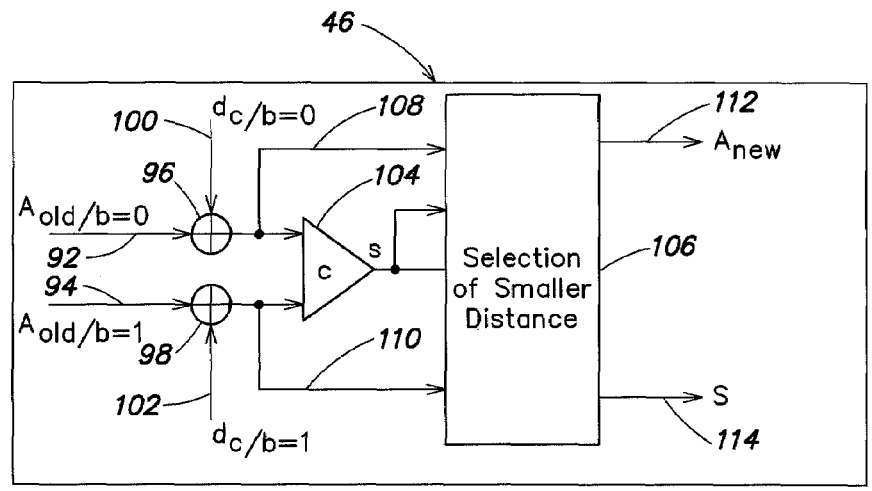
FIG. 2 is a block diagram of an accumulate-and-compare module within a Viterbi decoder.

This memory structure makes it possible to use a simplified accumulate-and-compare module 46 according to FIG. 2. Via two inputs, corresponding values $A_{old/b=0}$ and $A_{old/b=1}$ are applied on the lines 92, 94 to this module 46. The inputs on the lines 92, 94 are each conveyed to an input of a corresponding adder 96, 98. A distance value $d_{c/b=0}$ on a line 100 is applied to the first adder 96 for addition to the corresponding first input value. A corresponding distance value $d_{c/b=1}$ on a line 102 is applied to the second adder 98 for addition to the second input value on the line 94. The output values of the two adders 96, 98 are fed to a comparator 104. A control signal s is provided at an output of the comparator 104, which is fed to an output of the accumulate-and-compare module 46 and is also fed to a module 106 for selection of the smaller of the distances. Also, the added values on the lines 108, 110 of the two adders 96, 98 are fed to the module 106 for selection of the smaller distance. The calculation of the new value, that is, the selection of the found minimal distance $A_{new}$, takes place in the module 106 for selection of the smaller distance. Thus the accumulate-and-compare module 46 has two inputs for distances and two outputs, one for the found minimal distance $A_{new}$ on a line 112 and the other for control signal s on a line 114. Here s=0 if $A_{old/b=0} < A_{old/b=1}$, and s=1 otherwise.

The structure of the memory device 40 of FIG. 1 also makes possible a simplified realization of the entire Viterbi decoder 42, as illustrated in FIG. 3.

The arrangement and manner of functioning of the individual components of the decoder 42 of FIG. 3 is somewhat similar to the prior art decoder 10 of FIG. 8. The bidirectional path bus 30 of FIG. 8 is replaced with a unidirectional control path bus 50 in FIG. 3 from the computing device 44 having the accumulate-and-compare modules 46, 48 for the transmission of $1 \times 2^{p+1}$ bits to the memory 40.

As discussed above, the memory 40 comprises the path memory 52 and the demultiplexer 54. The path memory 52 stores $T \times 2^{L-1}$ bits. Further, the address line 56 leads to the memory 40 from the computing device 44, in particular from an output of a minimum-search module 116. The address line 56 serves to transmit an address of the state having the minimal distance q, with a data volume of L−1 bits, to feed the address to the demultiplexer 54. From the memory 40, or under control of the demultiplexer 54, the ultimately determined data bit string c(n, k) is provided on a line 118 to the output of the Viterbi decoder 42.

The wide path bus 30 according to the prior art decoder 10 of FIG. 8 is in this way replaced by the narrow control bus 50 (FIG. 3). The relatively large temporary memory 22, 32 for paths in the computing device 10 according to the prior art is replaced by relatively smaller temporary memories 120, 122. To this end there are other L−1 bits to be transmitted as the address q of the selected path. The demultiplexer 54 selects, for the reconstructed output bit c(n, k), the last bit in the path that corresponds to the minimal distance. A delay of the system clock frequency in the accumulate-and-compare module 46, 48 is obligatory so that the old distances in the distance memory can be overwritten with the newly calculated distances at the proper time. The minimum search involves an additional delay of D system clock cycles, so that the shift registers at the end of each path in the path memory 52 are formed as D+1 system clock cycles long in order for the corresponding output bit to be correctly associated with the minimum found. These delays also require a slight expansion, by one bit, of the value range for distance accumulators.

Figure 4:
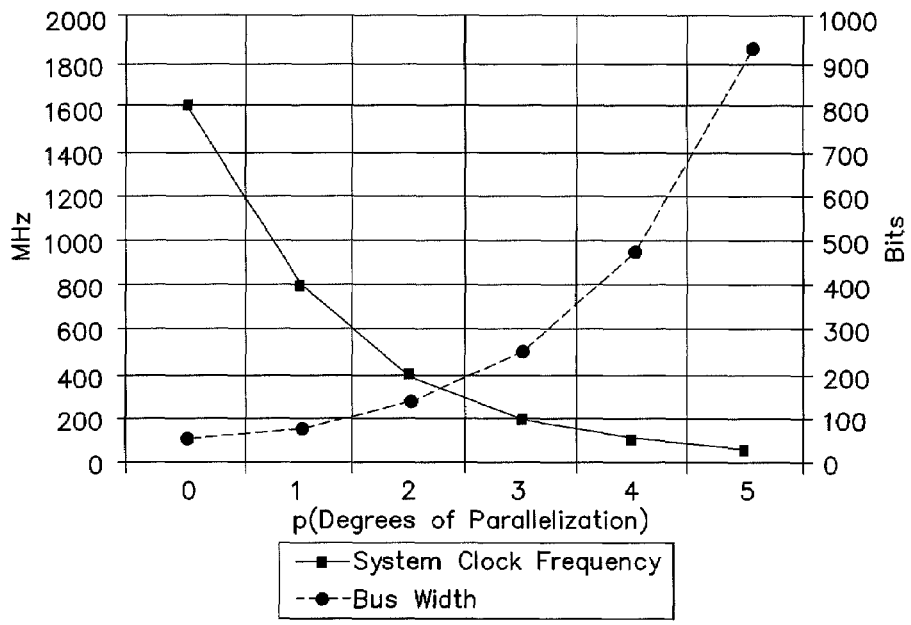
FIG. 4 is a graph illustrating the relationship of the system clock frequency and bus width as functions of the degree of parallelization for the Viterbi decoder of FIGS. 1-3.
Figure 9:
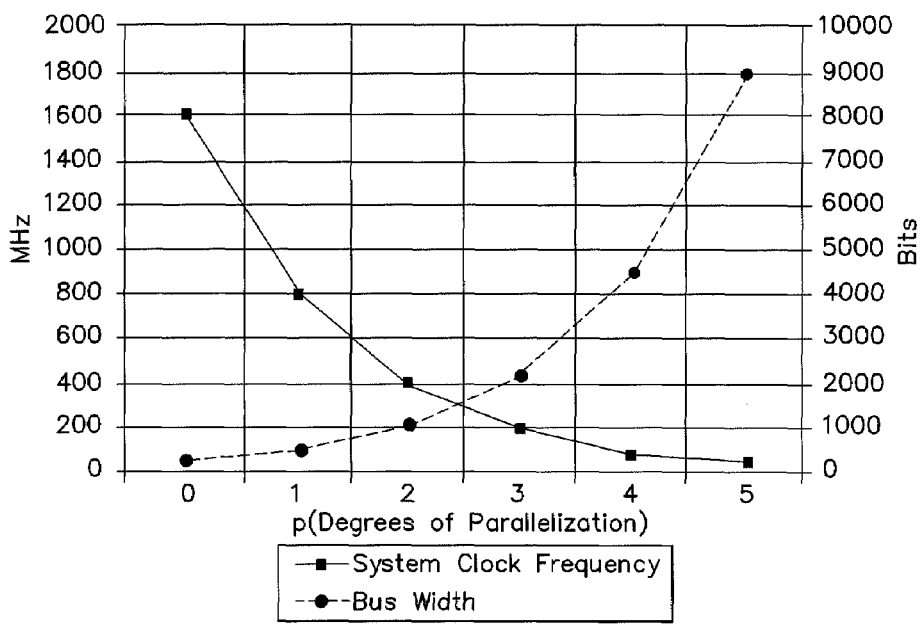
FIG. 9 is a graph illustrating the relationship of the system clock frequency and bus width as functions of the degree of parallelization of the prior art Viterbi decoder of FIG. 8.

The Viterbi decoder 42 offers a relaxed dependence between the system clock frequency and the bus widths, as illustrated in FIG. 4 for various degrees of parallelization p. For ease of comparison with FIG. 9, the same parameters have been used in FIG. 4 as in FIG. 9.

The Viterbi decoder 42 offers a relatively small bus width of 900 bits, which can be realized economically, even when the system clock frequency is equal to the data rate, which corresponds to a degree of parallelization p=5. In the DVB example, the system clock frequency is then 50 MHz. Given a system clock frequency of 100 MHz (i.e., a degree of parallelization p=4) the requisite bus width drops to 450 bits, which is a factor of 10 narrower than the requisite bus width according to standard memory structures.

Applied at the input of the Viterbi decoder 42 are data or data values r(n, k) on the line 12, which have been transmitted via a usually wireless interface of a communications system. The actual data to be sent, which on the receiver side for example are to be reconstructed using the Viterbi algorithm, are processed by error-protection encoding on the transmitter side. What follows is an explanation of the transmitter-side convolutional encoding of a bit string to be transmitted.

A data bit string $\{ \ldots, b(n), b(n+1), \ldots \}$ is to be transmitted. For the employment of the Viterbi algorithm on the receiver side, this data bit string is encoded in the following way on the transmitter side:

In a first step, the data of the data bit string are pushed into a shift buffer. At each step, the shift buffer of length L bits $\{B(0), B(1), \ldots, B(L-1)\}$ is shifted to the right $\{B(m)=B(m-1), m=2, 3, \ldots, L-1\}$ and filled with a new input bit $\{B(0)=b(n)\}$. The length L defines a parameter of the encoding, the "constraint length."

In a second step, K output bits $\{c(n, k), k=0, 1, \ldots, K-1\}$ are calculated according to the buffer state at the output. The calculation is uniquely determined with a set of K generator polynomials of length L $\{G(k, m), k=0, 1, \ldots, K-1, m=0, 1, \ldots, L-1\}$ with binary coefficients 0 or 1, according to equation 7:

$$c(n, k) = \sum_{m=0}^{L-1} G(k, m) \cdot B(m) = \sum_{m=0}^{L-1} G(k, m) \cdot b(n-m), \quad (7)$$

the additions in the sum being understood in the sense of modulo 2 addition (EXOR). The ratio between the number of useful bits at the input and the number of bits for transmission at the output is defined as a second parameter, namely the "code rate" R. In this case, R=1/K.

Third, to obtain different code rates R, the encoding described above is followed by the application of "puncturing" as a post-processing operation. In this process, from P successive sets of K bits, certain bits are dropped in accordance with a previously specified binary P-matrix $\{P(a, b),$ a=0, 1, \ldots, K-1, b=0, 1, \ldots, P-1\}$; these bits are marked with P(a, b)=0. With the number of ones in the matrix P1, the code rate can be determined as R=P/P1 lying between 1/K and 1, at most all the PK matrix coefficients being 1 and at least one 1 appearing in each P-column.

Figure 10:
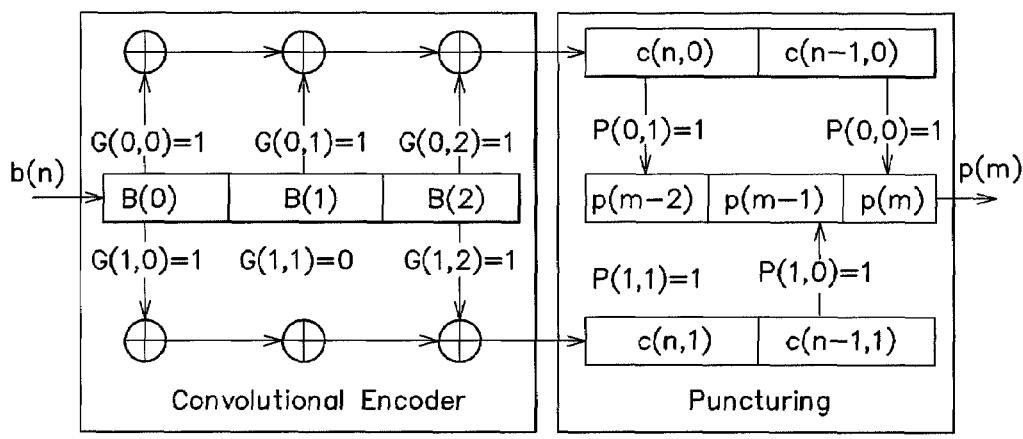
FIG. 10 is a diagram illustrating the principle of convolutional encoding.

FIG. 10 illustrates a prior art example in which the code word of a convolutional code can be infinitely long. A description of the encoding with a state diagram is helpful for analysis of the Viterbi algorithm. The state of the encoder is uniquely determined with the last L-1 bits of the buffer $Z_{B(1), \ldots, B(L-1)}$. In the binary case there are $2^{L-1}$ distinct states, and from each of them there are two possible transitions into a next state in dependence on the new bit at the input b=b(n). Upon each transition, K encoded bits $c=\{c(0), \ldots, c(K-1)\}$ are generated at the output. The generator polynomials are always selected such that all K bits in the two competing bit sets are distinct.

FIG. 11 is a state diagram of the convolutional encoder for the example of FIG. 10. From the state diagram it follows that only certain transitions are possible, for example from the states $\{Z_{00}, Z_{01}\}$ only to the states $\{Z_{00}, Z_{10}\}$ and from $\{Z_{10}, Z_{10}\}$ to the states $\{Z_{01}, Z_{11}\}$. This analysis can be generalized. Let all states be numbered with $\{Z_k, k=0, \ldots, 2^{L-1}\}$. The transition rule is then as follows:

$Z_K$ with b=0, the code being=c $\{Z_{2K}, Z_{2K+1}\} \Rightarrow k=0, \ldots, 2^{L-2}$ $Z_{2^{L-2}+k}$ with b=1, the code being=$\bar{c}$, where $\bar{c}$ denotes the inverted code word.

Next, the encoded data $\{p(m)\}$ are transmitted using a modulation, for example quadrature amplitude modulation ("QAM") or phase shift keying ("PSK"), over a channel, for example, a channel of a wireless interface of a communications system. As a result of the transmission, the data becomes distorted and noise and other interference signals are superimposed on the data. The original data are reconstructed with the Viterbi algorithm.

Although the present invention has been shown and described with respect to several preferred embodiments thereof, various changes, omissions and additions to the form and detail thereof, may be made therein, without departing from the spirit and scope of the invention.

What is claimed is:

1. A Viterbi decoder, comprising:
   a computing device configured to generate control signals dependent on a plurality of decisions associated with a plurality of paths and operable to decide data values, the computing device includes
      a data value input configured to receive sets of data values;
      a distance metric to calculate distances for the received sets of data values; and
      an accumulate-and-compare module operable to calculate distances for the received sets of data values;
   a unidirectional bus having a width of $1 \times 2^{((degree\ of\ parallelization)+1)}$ bits and configured to convey control signals;
   a path memory in communication with the computing device through the unidirectional bus, the path memory configured to store the decided data values; and
   an output in communication with the path memory to provide at least one output value;
   where one of the computing device and the path memory shifts data strings in the path memory according to conditions of Viterbi decoding with the control signals associated with the plurality of paths.

2. The Viterbi decoder of claim 1, where the computing device further comprises a module that evaluates the distances required for each of the sets of the received data values, and a distance memory that stores results of the accumulate and compare operations performed by the computing device.

3. The Viterbi decoder of claim 1, where the path memory comprises a first controlled memory portion and a second shift register portion, where one of the computing device and the path memory delays the data strings in the shift memory portion of the path memory to compensate for a requisite time for a search among the selected accumulated distances.

4. The Viterbi decoder of claim 1, further comprising a path memory output operable to provide an output signal that corresponds to the path found by a search that determines a relatively smallest one of the calculated distances, where the output signal is provided by one of the computing device and the path memory.

5. The Viterbi decoder of claim 1, further comprising temporary memory operable to store calculated distances, where the computing device subtracts a found relatively smallest distance from all of the calculated distances in a subsequent cycle of the decoder.

6. The Viterbi decoder of claim 1, where the path memory comprises a row structure that accepts row-wise paths (m(p, t)) from the data strings that lead to a state and that are to be shifted in each decoder cycle, for accepting paths m(p, t) with $p=0, 1, \ldots, P-1$, where P is the number of paths, and $t=0, 1, \ldots, T-1+D$, where T is the decoder depth and D is the delay.

7. The Viterbi decoder of claim 1, where
the path memory has a first controlled memory portion and a second shift register portion; and
the path memory executes the shift according to the Viterbi decoding in the first controlled memory portion with a specified length (T), and executes a delay in the second shift register portion having a further length (D).

8. The Viterbi decoder of claim 1, where the computing device is configured in relation with the path memory where one of the computing device and the path memory writes, in each decoder cycle, an initial value in each of the paths ($\{m(p, 0), p=0, 1, \ldots, P-1\}$) in accordance with a fixed pattern that depends on a path number.

9. The Viterbi decoder of claim 1, where
the path memory has a first controlled memory portion; and
one of the computing device and the path memory (controls the data shift with respect to the paths (m(p, t)) in the first controlled memory portion of the path memory, using the control signals (s) at the input of the path memory, according to $m(p, t) = m(2p+s(p), t-1)$ with $p=0, 1, \ldots, P/2-1$, and $m(P/2+p, t) = m(2p+s(P/2+p)$ with $t-1)$, $t=1, 2, \ldots, T-1$, where $s(p) \in (0, 1, \ldots, S-1)$, $p=0, 1, \ldots, P-1$, S being the number of possible data values.

10. The Viterbi decoder of claim 1, where
the path memory has a second shift register portion;
one of the computing device and the path memory executes the shift in the second shift register portion according to $m(p, t) = m(p, t-1)$ with $p=0, 1, \ldots, P-1$, $t=T, \ldots, T+D-1$, and
determines as the output value the selected path (q) having the relatively smallest distance, according to output=m(q, T+D-1).

* * * * *